United States Patent [19]
Chung et al.

[11] Patent Number: 5,633,505
[45] Date of Patent: May 27, 1997

[54] SEMICONDUCTOR WAFER INCORPORATING MARKS FOR INSPECTING FIRST LAYER OVERLAY SHIFT IN GLOBAL ALIGNMENT PROCESS

[75] Inventors: Wen-Jye Chung, Shuang-Shi; Chu-Mei Lee, Chu-Dung, both of Taiwan

[73] Assignee: Taiwan Semiconductor Manufacturing Company, Ltd., Hsin-Chu, Taiwan

[21] Appl. No.: 650,666

[22] Filed: May 20, 1996

Related U.S. Application Data

[62] Division of Ser. No. 536,478, Sep. 29, 1995, Pat. No. 5,545,570.

[51] Int. Cl.⁶ ................................. H01L 23/544
[52] U.S. Cl. .......................... 250/491.1; 257/797
[58] Field of Search ................. 250/491.1; 257/797

[56] References Cited

U.S. PATENT DOCUMENTS

| | | | |
|---|---|---|---|
| 4,642,672 | 2/1987 | Kitakata | 257/797 |
| 5,332,470 | 7/1994 | Crotti | 156/659.1 |
| 5,365,072 | 11/1994 | Turner et al. | 250/491.1 |

*Primary Examiner*—Jack I. Berman
*Attorney, Agent, or Firm*—George O. Saile; Graham S. Jones, II

[57] ABSTRACT

An inspection pattern on a semiconductor wafer for inspecting is used to determine the degree of alignment of a first device layer during manufacture of integrated circuits on a semiconductor substrate the following steps. Form a zeroth layer on the substrate. The alignment marks and zeroth layer mother overlay inspection patterns are patterned simultaneously in the zeroth layer aligning to alignment marks formed in the zeroth layer. Then one forms a first layer on the substrate patterned simultaneously with formation of child overlay inspection patterns patterned in the sake position as the zeroth layer mother inspection patterns to determine the overlay shift of the first layer.

2 Claims, 4 Drawing Sheets

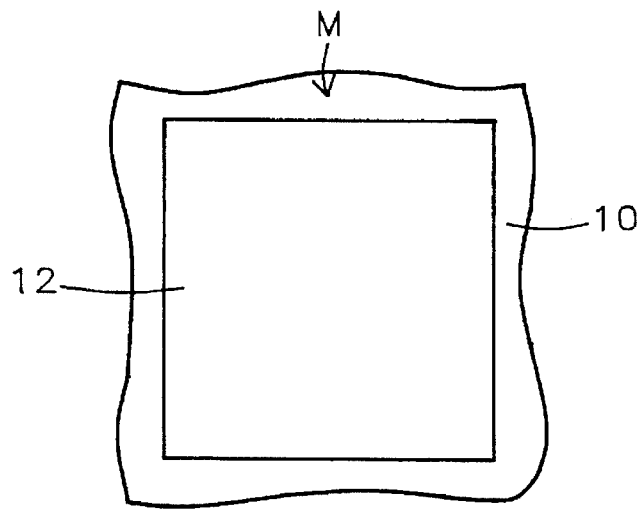
FIG. 1A - Prior Art
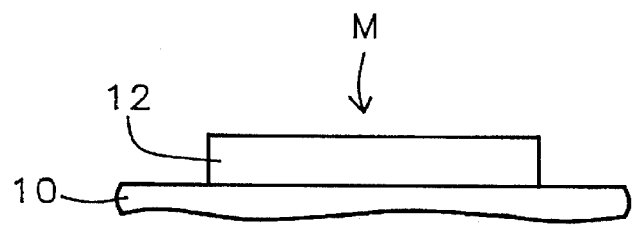
FIG. 1B - Prior Art
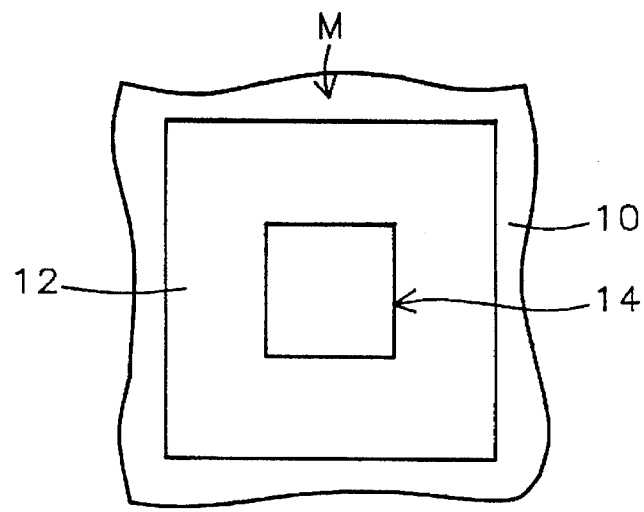
FIG. 2A - Prior Art

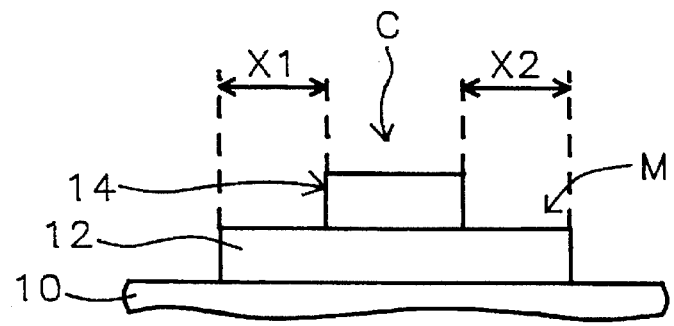
FIG. 2B – Prior Art
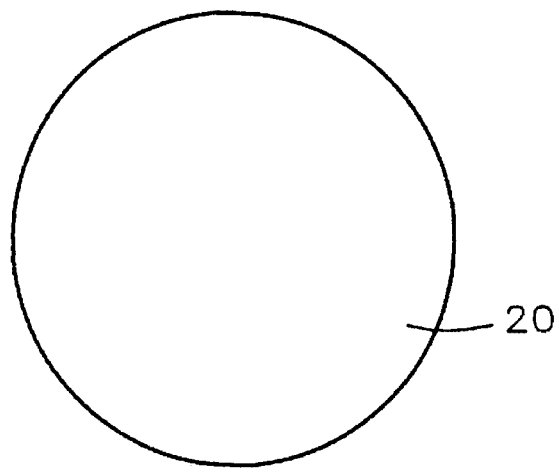
FIG. 3A – Prior Art
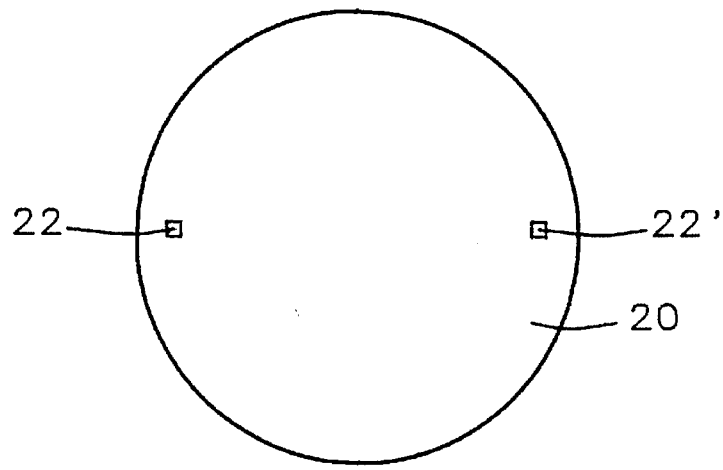
FIG. 3B – Prior Art

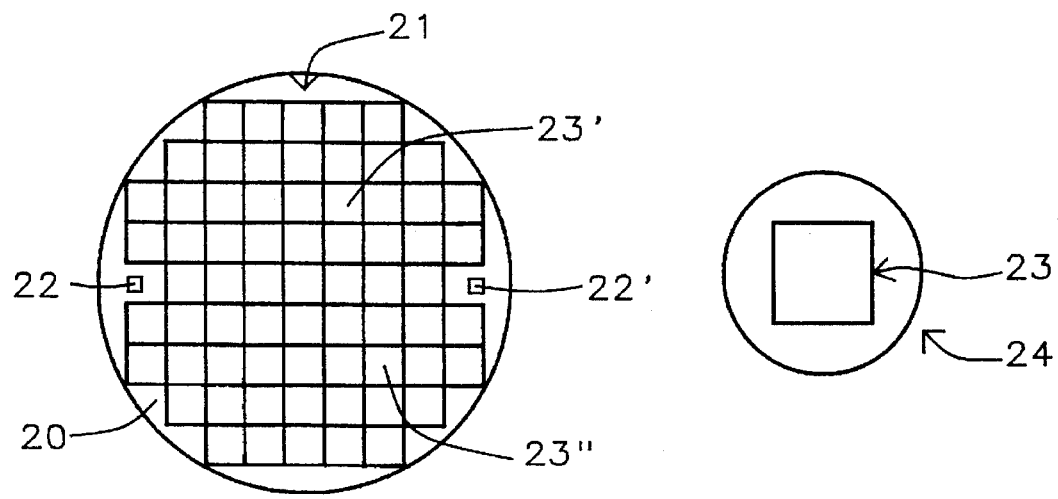
*FIG. 3C - Prior Art*
*FIG. 4A - Prior Art*
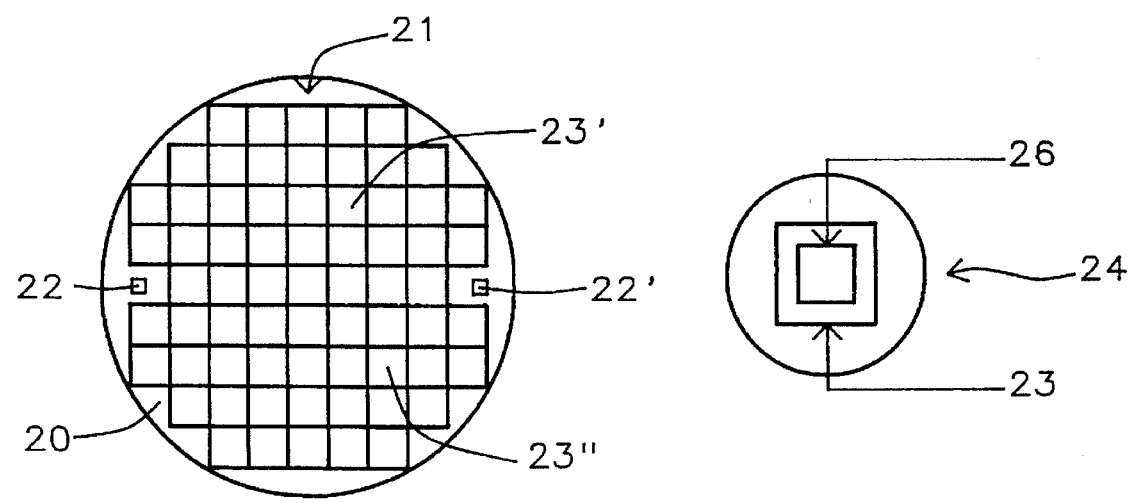
*FIG. 3D - Prior Art*
*FIG. 4B - Prior Art*

5,633,505

1

SEMICONDUCTOR WAFER INCORPORATING MARKS FOR INSPECTING FIRST LAYER OVERLAY SHIFT IN GLOBAL ALIGNMENT PROCESS

This is a divisional application of Ser. No. 08/536,478 filed on Sep. 29, 1995, now U.S. Pat. No. 5,545,570.

BACKGROUND OF THE INVENTION

1. Field of the Invention

This invention relates to microlithography in the manufacture of integrated circuit chips on wafers and to the measurement of overlay of the first layer.

2. Description of Related Art

In microlithography, difficulties exist in the accurate measurement of overlay (O/L), which comprises the degree of misalignment between successive layers of patterns on a thin film electronic structure and in aligning the masks/reticles used to print such layers to preceding layers.

In microlithography, the measurement of overlay is important. Overlay, as used here, comprises the degree of misalignment between successive layers of patterns on thin film electronic structures and the preceding layers.

Some commercially available exposure systems use a method to align the wafers. When using the global alignment method, global alignment marks are patterned by an independent process layer (so called zeroth layer), then all the device process layers are aligned to the global alignment marks. For all of the device layers beside the first layer, there are some existing technologies to measure the degree of overlay shift. All of these measurement technologies use some specially designed representative patterns, which come from both successive and preceding layers, on scribe lines to check the overlay. For the first layer, which can be made by a process such as the formation of a well in a CMOS (Complementary Metal Oxide Semiconductor) device, it is difficult to determine the overlay because there are no preceding inspection patterns of the (zeroth) layer on the scribe lines. That makes for considerable rework and/or scrap when the exposure system has an overlay shift problem. At the same time, much time is required to check the machine and the production must be interrupted when one doubts that the overlay performance of one exposure system is satisfactory.

FIGS. 1A, 1B, 2A and 2B show an example of a prior art system for overlay measurement of device layers.

FIG. 1A shows a plan view of a substrate 10 with a first, large, mother box M patterned as an overlay inspection (mother) feature. Mother box M is patterned in the first layer 12 formed on substrate 10.

FIG. 1B is an elevation view of FIG. 1A with showing mother box M comprising a shaped pattern formed in the layer 12 which overlies the substrate 10.

FIG. 2A shows the product of FIGS. 1A and 1B after forming a second, smaller, child box C in a successive second layer 14 which overlies the first layer 12. The smaller child box C is patterned from the large mother box M (the mother feature) in the preceding layer 12. The small box C formed in the second layer 14 formed by this process comprises the child overlay inspection feature.

Referring to FIG. 2B, X1 represents the distance between the left edges of the mother box M and the child box C. The distance X2 is the distance between the right edges of the mother box M and the child box C. The centers of these two boxes M and C are designed at the same position so the overlay of the successive layer to the preceding layer can be determined by the formula as follows:

$$\text{Overlay shift} = (X2-X1)/2.$$

FIGS. 3A–3C and FIGS. 4A–4B show an example of a prior art wafer being processed by the prior art global alignment method.

FIG. 3A shows a bright new wafer 20 which is shown to be without any pattern thereon.

FIG. 3B is the wafer 20 after zeroth layer process, with global alignment marks 22 and 22' which have been patterned on wafer 20 for the alignment of following layers.

FIG. 3C shows the wafer 20 after the patterning process of the first layer 21 formed on wafer 20 by use of a prior art process of manufacture of chip forming representative patterns 23' and 23" in an array of patterns formed from the first layer 21.

To the right of FIG. 3C, FIG. 4A shows a blown up image 24 showing a pattern 23 which is a magnified image representing patterns 23' and 23". The box pattern 23 is formed in the first layer 21. The pattern 23 is patterned at scribe lines as the mother overlay Inspection feature for measurement of overlay in successive layers.

FIG. 3D shows the wafer 20 after the process of patterning another layer subsequent to the first layer 21 forming a child overlay inspection features on the mother overlay features 23', 23" as is Illustrated in FIG. 4B.

FIG. 4B is a blown up area 24 on the wafer 20 shown in FIG. 3D showing magnified images illustrative of the overlay Inspection features 23 and 26. The smaller box 26 is patterned in the upper layer in the same position as the mother box 23 providing a mother/child overlay inspection set of features.

Similarly to the markings seen In FIGS. 1A, 1B, 2A and 2B, the combination of mother box 23 and child box 26 can be used to the measure overlay of any layers beside the first layer. This Illustrates the problem of conventional technology. The layers formed after the first layer 21 have one or more preceding layer(s) to measure the overlay but there is no layer preceding to the first layer to print the mother overlay inspection feature (big box 23, for example) in scribe lines.

Therefore it is difficult to determine the overlay of the first layer such as layer 12 in FIG. 2B and layer 23 in FIG. 3D, in a conventional process.

SUMMARY OF THE INVENTION

A mother overlay inspection feature is applied superimposed upon the global alignment mark during the formation of the zeroth layer. By using the zeroth layer as the preceding layer of the first device layer, that pattern can be used to check the overlay of the first device layer.

A method of forming an inspection pattern on a semiconductor wafer for inspecting to determine the degree of alignment of a first device layer during manufacture of integrated circuits on a semiconductor substrate the following steps. Form a zeroth layer on the substrate, patterning alignment marks and zeroth layer mother overlay inspection patterns simultaneously in the zeroth layer aligning to alignment marks formed in the zeroth layer. Form a first layer on the substrate. Pattern the first layer simultaneously with formation of child overlay inspection patterns patterned in the same position as the zeroth layer mother inspection patterns to determine the overlay shift of the first layer.

Preferably the overlay inspection patterns are juxtaposed with the global alignment marks.

A semiconductor wafer incorporates an inspection pattern on the semiconductor wafer for inspecting to determine the degree of alignment of a first device layer during manufacture of integrated circuits on a semiconductor substrate. A zeroth layer is formed on the substrate patterned with alignment marks and zeroth layer mother overlay inspection patterns formed in the zeroth layer. A first layer on the substrate is patterned with child overlay inspection patterns patterned in the same position as the zeroth layer mother inspection patterns. Thus, it is possible to determine the overlay shift of the first layer with the mother inspection pattern and the child overlay inspection pattern.

Preferably the overlay inspection patterns are Juxtaposed with the global alignment marks.

BRIEF DESCRIPTION OF THE DRAWINGS

The foregoing and other aspects and advantages of this invention are explained and described below with reference to the accompanying drawings, in which:

FIGS. 1A, 1B, 2A and 2B show an example of a prior art system for overlay measurement of device layers.

FIGS. 3A–3D and FIGS. 4A–4B show an example of a prior art wafer being processed by the prior art global alignment method.

DESCRIPTION OF THE PREFERRED EMBODIMENT

FIGS. 5A–5C and 6A–6B illustrate a process performed on a wafer 30 In accordance with the global alignment method modified to incorporate the first layer overlay inspection method in accordance with this invention.

Figure 5A:
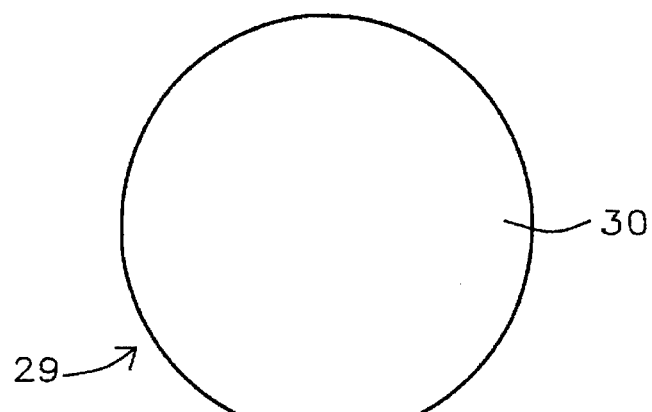
FIGS. 5A–5C and 6A–6B illustrate a process performed on a wafer in accordance with the global alignment method modified to incorporate the first layer overlay inspection method in accordance with this invention.

FIG. 5A shows a bright new wafer 30 without any pattern thereon.

Figure 5B:
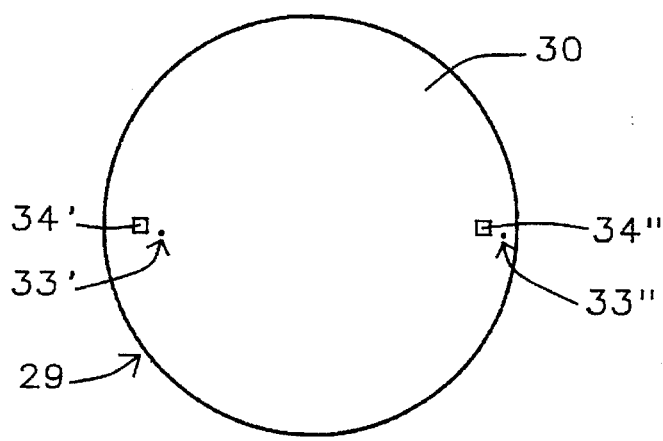

FIG. 5B shows the wafer 30 after performing the zeroth layer step of processing in accordance with this invention. During the zeroth level step, two of global alignment marks 32' and 32" are provided with one on the left side of wafer 30 and with the other on the right side of wafer 30.

In addition, during the formation of marks 32' and 32" a set of boxes comprising mother overlay inspection features 34' and 34" are formed simultaneously on the left and right sides of wafer 30 Juxtaposed with the global alignment marks.

The marks 32' and 32" and boxes 34' and 34" are patterned in the zeroth layer simultaneously using conventional process steps incorporating formation of thin films. For example, methods of deposition can be used such as a chemical vapor deposition (CVD), sputtering, or evaporation to form the zeroth layer. The zeroth layer can then be patterned with masks formed by well known, standard photolithographic techniques of pattern formation. Using the masks the patterns can be formed in the zeroth layer by well know etching techniques.

Figure 6A:
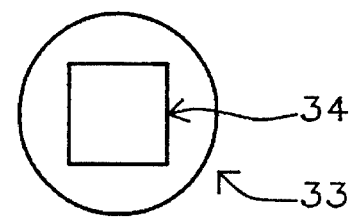

FIG. 6A shows a blown up image of an area 33 on the surface of wafer 30 showing a mark 34 representative of the left hand box 34' and right hand box 34" on wafer 30 in FIG. 5B. Mark 34 comprises a mother box 34 formed in area 33 as the mother overlay inspection feature 33.

Figure 5C:
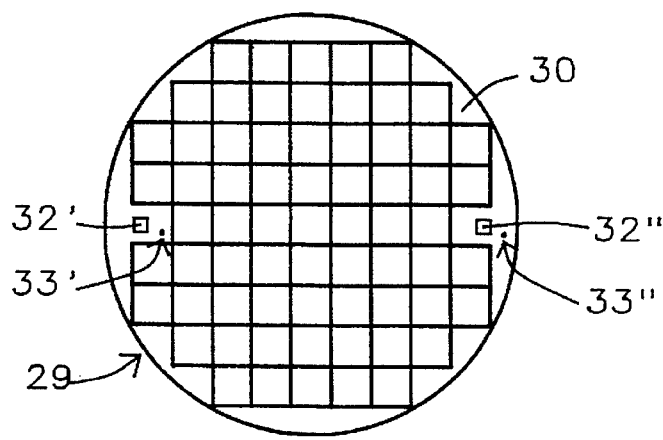

FIG. 5C shows the wafer 30 after performance of the first layer process which involves forming a blanket layer of a thin film over the wafer device 29 as shown of FIG. 5B and then patterning the first layer. The first layer can be formed by well known techniques. For example, deposition methods can be used such as a chemical vapor deposition (CVD) process, sputtering, or evaporation to form the first layer. The first layer can then be patterned with masks formed by well known, standard photolithographic techniques of pattern formation. Using the masks the patterns in the first layer can be formed by well know etching techniques.

Figure 6B:
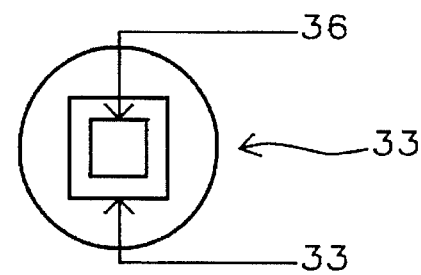

FIG. 6B shows a blown up image of overlay inspection features of an area 33 representative of areas 32' and 32" on the surface of wafer 30 in FIG. 5C. FIG. 6B shows a mother mark 34 carrying a child mark 36 in the center thereof. Mark 34 comprises a mother box 34 formed in area 33 as the mother overlay inspection feature 33. The child overlay inspection features 36 are patterned in the same location as the mother marks 34. The combination of marks 34 and 36 can be used to measure the overlay of the first layer on wafer 30.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the Invention encompasses the subject matter of the claims which follow.

Having thus described the invention, what is claimed as new and desirable to be secured by Letters Patent is as follows:

1. A semiconductor wafer incorporates an inspection pattern on said semiconductor wafer for inspecting to determine the degree of alignment of a first device layer during manufacture of integrated circuits on a semiconductor substrate, comprising a zeroth layer formed on said substrate patterned with global alignment marks and zeroth layer mother overlay inspection patterns formed in said zeroth layer, a first layer on said substrate patterned with child overlay inspection patterns patterned in the same position as said zeroth layer mother inspection patterns, whereby it is possible to determine the overlay shift of said first layer with said mother inspection pattern and said child overlay inspection pattern.

2. A wafer in accordance with claim 1 wherein said overlay inspection patterns are Juxtaposed with said global alignment marks.

* * * * *